United States Patent [19]
Toyoda et al.

[11] Patent Number: 5,739,560
[45] Date of Patent: Apr. 14, 1998

[54] HIGH FREQUENCY MASTERSLICE MONOLITHIC INTEGRATED CIRCUIT

[75] Inventors: Ichihiko Toyoda; Tsuneo Tokumitsu; Kenjiro Nishikawa, all of Yokosuka; Kenji Kamogawa, Yokohama, all of Japan

[73] Assignee: Nippon Telegraph and Telephone Corporation, Tokyo, Japan

[21] Appl. No.: 528,411

[22] Filed: Sep. 14, 1995

[30] Foreign Application Priority Data

Sep. 22, 1994 [JP] Japan ................................ 6-228170

[51] Int. Cl.⁶ ............................ H01L 27/10; H01L 29/00
[52] U.S. Cl. .................... 257/211; 257/203; 257/204; 257/205; 257/206; 257/207; 257/208; 257/379; 257/503; 257/508; 257/659
[58] Field of Search ........................... 257/203, 204, 257/205, 206, 207, 208, 209, 210, 211, 379, 503, 508, 659

[56] References Cited

U.S. PATENT DOCUMENTS

| 4,641,108 | 2/1987 | Gill, Jr. |
| 4,811,082 | 3/1989 | Jacobs et al. |
| 4,933,860 | 6/1990 | Liu. |
| 5,223,735 | 6/1993 | Kinoshita. |
| 5,517,055 | 5/1996 | Pasch .............................. 257/657 |

FOREIGN PATENT DOCUMENTS

| 60-224244 | 11/1985 | Japan. |
| 61-236141 | 10/1986 | Japan. |
| 63-007648 | 1/1988 | Japan. |
| 63-221649 | 9/1988 | Japan. |
| 1-128543 | 5/1989 | Japan. |
| 3-108760 | 5/1991 | Japan. |
| 4-69950 | 3/1992 | Japan. |
| 5-129803 | 5/1993 | Japan. |
| 5-299622 | 11/1993 | Japan. |
| 6-084913 | 3/1994 | Japan. |

OTHER PUBLICATIONS

Turner et al, "Application Specific MMIC: A Unique and Affordable Approach to MMIC Development", IEEE 1988 Microwave and Millimeter–Wave Monolithic Circuits Symposium, pp.9–14.

Blumberg et al, "A 640K Transitor Sea–of–Gates 1.2μ Micron HCMOS Technology",IEEE International Solid––State Circuits Conference, Feb. 17, 1988, pp. 74, 75, 308.

Banba et al, "Small–Sized MMIC Amplifiers Using Thin Dielectric Layers", IEEE Transtions on Microwave Theory and Techniques, vol. 43, No. 3, Mar. 1995, pp. 485–492.

Fukuda et al, "A CMOS Pair–Transitor Array Master–slice", 1982 Symposium on VLSI Technology, IEEE Cat. No. 82 CH 1822–6, Sept. 1–3, 1982/Kanagawa, pp. 16.17.

Primary Examiner—Ngân V. Ngô
Attorney, Agent, or Firm—Spencer & Frank

[57] ABSTRACT

A monolithic integrated circuit utilizing areas associated with unused devices for wiring signal lines, thereby implementing effective wiring and improving high frequency characteristics. A common substrate consisting of a semiconductor substrate, and active devices, capacitor electrodes and resistors formed on the semiconductor substrate, is followed by a dielectric film, a ground metal, a dielectric film whose thickness is equal to or greater than 1 μm, and signal lines. A desired circuit is formed by connecting the signal lines with electrodes of the active devices and other elements via, holes in the dielectric films, and windows of the ground metal. The windows of the ground metal are formed over portions of active devices which are used as components of the circuit.

31 Claims, 10 Drawing Sheets

HIGH FREQUENCY MASTERSLICE MONOLITHIC INTEGRATED CIRCUIT

BACKGROUND OF THE INVENTION

1. Field of the Invention

The present invention relates to a high frequency monolithic integrated circuit including a semiconductor substrate provided with a number of active devices formed thereon.

2. Description of Related Art

A remarkable development of rencent mobile communications urgently requires fabricating integrated circuits in a short development time and at low manufacturing cost. Thus, various proposals have been offered for the requirement.

FIG. 1 is a plan view showing first example of a conventional monolithic integrated circuit which includes a semiconductor substrate 1. The semiconductor substrate 1 is provided with active devices 2 such as FETs, passive elements such as inductors 3 and capacitors 4, and signal line patterns 5, which are formed on its main surface to construct a circuit.

The conventional monolithic integrated circuit has different device arrangements for different circuit functions, and hence different photomasks are required for respective different function circuits in the semiconductor integrated circuit fabrication process (called the "semiconductor process" hereinafter). A normal semiconductor process for monolithic integrated circuits requires about a dozen photomasks and two or so months to form active devices. In other words, more than half the number of photomasks and ⅔ of the time period of the entire semiconductor process are consumed for forming active devices. Accordingly, the ratio of the cost of photomasks to the entire fabrication cost is large, especially in a low volume, wide variety production system, and it takes a long time for the fabrication.

As an attempt to solve this problem, a second prior art approach for a master-slice monolithic integrated circuit has been proposed in the US, as reviewed in a technical paper in 1988 (E. Turner et al. "APPLICATION SPECIFIC MMIC: A UNIQUE AND AFFORDABLE APPROACH TO MMIC DEVELOPMENT", IEEE, 1988, Microwave and Millimeter-Wave Circuit Symposium, pp. 9–14).

FIG. 2 shows a master-slice monolithic integrated circuit. It is fabricated by first forming on the surface of a semiconductor substrate 1 active devices 2 such as FETs including a source 2S, a drain 2D and a gate 2G, and lower electrode conductors 6 of thin film capacitors to build a common substrate, followed by forming metalization patterns for signal lines (wiring) on the common substrate to implement circuits of different functions for various frequency bands.

FIG. 3A is an example of a 27 GHz narrowband amplifier implemented by forming signal lines 5 on the common substrate as shown in FIG. 2, and FIG. 3B is an example of 30 GHz wideband amplifier implemented by forming signal lines 5' on the common substrate as shown in FIG. 2.

As shown in these figures, the master-slice monolithic integrated circuit can implement various function circuits on the same common substrates from amplifiers to oscillators and frequency converters by changing the metalization patterns for the signal lines formed over the common substrate on which the active devices are preformed. This is because circuits of various functions are formed on the same active device arrangement, and hence the photomasks for forming the active devices can be commonly used, thereby solving the above-mentioned problem of the fabrication cost in the monolithic integrated circuit. In addition, this presents a great advantage over the first conventional semiconductor process, which takes a number of processes and long time to form active devices, since the turn around time for developing circuits is greatly shortened because the semiconductor process can be started before the circuit design by utilizing the active devices arranged in the same fashion. Moreover, although ten or more wafers are generally manufactured at a time in a common semiconductor process, even a small volume production which produces only one or two wafers would be economical enough in the master-slice monolithic integrated circuit because the common substrates can be mass produced. Furthermore, the master-slice monolithic integrated circuit can increase versatility of the common substrate by disposing the active devices on the substrate in an array.

As other conventional techniques similar to the master-slice technique, gate array techniques in the LSI fabrication process and analog master-slice techniques employed in analog-digital hybrid ASICs (Application-Specific Integrated Circuits) are known.

FIGS. 4A and 4B show a CMOS gate array as a third prior art technique. This technique is disclosed by R. Blumberg et al., "A 640K Transistor Sea-of Gates 1.2 Micron HCMOS Technology", IEEE international Solid State Circuits Conference, Feb. 17, 1988 (see also, "ASIC Handbook" published by Industrial Research Center of Japan). FIG. 4A is a plan view of a basic internal cell including a p-diffusion layer 11, an n-diffusion layer 12 and gates 13, which are formed on a substrate. A master cell is constructed by arraying such basic internal cells. For example, a two input NAND circuit can be implemented by providing the basic internal cell with first layer signal lines 14 and a second layer signal line 15 as shown in FIG. 4B. An analog master-slice circuit can be implemented in a similar manner. These techniques implement user specified logics or characteristics by connecting in wiring processes components of basic devices such as transistors prearranged on a chip, as in the master-slice monolithic integrated circuit.

A fourth prior art technique has been proposed by S. Banba et al., "Small-Sized MMIC Amplifiers Using Thin Dielectric Layers", IEEE, TRANSACTIONS ON MICROWAVE THEORY AND TECHNIQUES, VOL. 43, NO. 3, MARCH 1995. This technique tries to reduce chip dimension and fabrication cost by forming a multilayer passive circuit on a substrate.

In the first prior art technique, since the ratio of the passive elements is large, and the layout of the components has great influence on the circuit characteristics, the layout must be designed individually for respective types of IC circuits. This increases the development term and manufacturing cost.

The second prior art techniques poses a problem in that the semiconductor substrates include considerable dead spaces because the circuit components are two-dimensionally connected, and hence the components must be spaced to some extent in advance to reserve areas for forming signal lines.

When the active devices are arrayed, some portions of the arrayed active devices are selected for use to achieve a desired function. Accordingly, there remain some unused active devices, on which other high frequency passive circuits or transmission lines cannot be formed in the conventional master-slice monolithic integrated circuits. Therefore, some areas must be reserved for forming passive elements and passive circuits, and this poses a problem in that it further increases dead spaces on the substrate. Thus, portions associated with the active devices which do not contribute to the circuit operation must be left, and this hinders the circuit from being reduced in size and cost. In addition, since the active devices, passive elements and signal lines are coplanarly formed, and the active devices are formed at predetermined positions, the degree of freedom for forming the passive elements and signal lines is limited. This presents another problem in that extra signal lines must be drawn for bypassing the active devices, and this causes stray capacitance, inductance and resistance, thereby degrading the circuit characteristics. Furthermore, it is necessary to widen spaces between the devices to increase the degree of freedom for wiring, which is impractical because of an increase in size.

In the gate array techniques, or in the analog master-slice techniques as in the analog-digital hybrid ASIC processes of the third prior art, the post-processing based on a user's specification is only a wiring process in almost all cases. In the wiring process, dielectric films used for insulation are thin, such as 0.5 to 0.7 micron in thickness, and no ground metal is used. As a result, signal lines formed in the wiring process cannot function as high frequency transmission lines, but are used only as plain connections. In other words, it is impossible to accurately determine the characteristic impedance and electrical length of the signal lines in a high frequency range, in which the signal lines must be handled as distributed elements. Furthermore, the transmission loss can be extremely high, which is not acceptable for high frequency circuit design. Thus, the frequency is limited to which the gate array or the analog master-slice technique can be applied. Moreover, since the signal lines cannot be handled as distributed elements, practical circuit functions such as hybrids commonly used in high frequency circuits cannot be formed in the post-process.

SUMMARY OF THE INVENTION

It is therefore an object of the present invention to provide a monolithic integrated circuit which can be effectively applied to monolithic integrated circuits in microwave and higher frequency region (MMICs: Monolithic Microwave Integrated Circuits).

In one aspect of the present invention, there is provided a monolithic integrated circuit comprising:

a semiconductor substrate on which a plurality of active devices are formed;

a first dielectric film formed on the active devices;

a selecting plate formed on the first dielectric film, the selecting plate consisting of one or more windows and a covering portion, the windows being formed over active devices to be used among the active devices, and the covering portion covering active devices to be unused among the active devices;

a signal line layer formed on the selecting plate; and connecting means for connecting the active devices to be used with the signal line layer.

The selecting plate may consist of a first ground metal.

The space between the semiconductor substrate and the first ground metal may be 1,000–5,000 angstroms.

The signal line layer may comprise first signal lines for interconnecting the active devices to be used, and a first signal line layer dielectric film formed between the selecting plate and the first signal lines.

The first signal line layer dielectric film may be equal to or greater than one micron in thickness.

The signal line layer may consist of a multilayer passive circuit.

The signal line layer may comprise a first signal line layer dielectric film formed on the selecting plate, a first signal line formed on the first signal line layer dielectric film, a second signal line layer dielectric film formed on the first signal line, and a second signal line formed on the second signal line layer dielectric film.

The first signal line layer dielectric film and the second signal line layer dielectric film may be each equal to or greater than one micron in thickness.

The monolithic integrated circuit may further comprise:
 a second dielectric film formed on the first signal line; and
 a second ground metal formed between the second dielectric film and the second signal line layer dielectric film.

The first signal line layer dielectric film, the second signal line layer dielectric film, and the second dielectric film may be each equal to or greater than one micron in thickness.

The active devices on the semiconductor substrate may be juxtaposed with a plurality of passive elements formed on the semiconductor substrate, one or more elements of the passive elements being connected with the signal line layer.

The passive elements may comprise a plurality of first capacitor electrode conductors formed on the semiconductor substrate, one or more pieces of the first capacitor electrode conductors forming capacitors with the selecting plate and the first dielectric film, wherein the capacitors are connected to the signal line layer.

The monolithic integrated circuit may further comprise a plurality of second capacitor electrode conductors which are formed on a same plane as the selecting plate and insulated from the selecting plate, wherein the passive elements may comprise a plurality of first capacitor electrode conductors formed on the semiconductor substrate, wherein one or more pieces of the first capacitor electrode conductors may form capacitors with corresponding portions of the second capacitor electrode conductors and the first dielectric film, and wherein the capacitors may be connected to the signal line layer.

The signal line layer may comprise one or more passive elements which are connected to the active devices to be used.

The signal line layer may comprise a coplanar waveguide which is connected to the active devices to be used.

According to the present invention, the positions of the active devices or the like on the semiconductor substrate can be determined in advance. This makes it possible to use the semiconductor substrate provided with the active devices formed thereon in common to various circuits, and hence to reduce the fabrication cost and development term even in a small volume, wide variety production system.

Furthermore, since the unused devices are covered with the flat ground metal associated with dielectric multilayers over the ground metal, signal lines can be provided immediately over the unused devices. This obviates areas dedicated to signal lines in the conventional integrated circuits, which makes it possible to effectively utilize the space on the semiconductor substrate, thereby reducing the circuit size.

Moreover, since the unused devices covered with the ground metal have little effect on the circuit formed thereon, the circuit can be formed regardless of the positions of the active devices preformed on the substrate. This can increase the degree of freedom for wiring circuit pattern layout, and prevent extra signal lines from being drawn in a such manner as bypassing the active devices. Thus, the effect of stray inductance and capacitance can be reduced, thereby achieving high performance circuits.

In addition, since the signal lines are formed over the planar ground metal via the dielectric film, the characteristic impedance and the electrical length thereof can be determined accurately. As a result, the signal lines can be used as high frequency transmission lines, and hence high frequency functional circuits such as hybrids can be implemented.

Furthermore, stacking passive circuits over the ground metal permits implementation of highly integrated passive circuits, thereby achieving a further size reduction of the circuit.

The foregoing fourth prior art or Japanese patent application laying-open No. 129803/1993 discloses the technique using a ground metal. More specifically, the fourth prior art has a ground metal inserted between two signal line layers, thereby preventing interference between signal lines. On the other hand, Japanese patent application laying-open No. 129803/1993 comprises the ground metal 14 inserted between the first dielectric film 12 and the second dielectric film 13, thereby preventing the interference between strip metals 15 and 16 formed in such a fashion that they sandwich the dielectric layers 12 and 13. These ground metals, however, differ from the ground metal of the present invention in the following:

(1) The ground metal of the present invention selects and separates the active devices to be used from the active devices to be unused by covering the unused active devices. This enables passive elements to be formed over the active devices to be unused. In other words, the ground metal is provided for separating the passive elements from the active devices to be unused. In contrast, the ground metals of the prior arts are provided to prevent interferences between signal lines disposed over and under the ground metals. Considering that the unused active devices do not carry signals, it is clear that the ground metal of the present invention is not provided for the purpose of preventing interference.

(2) Furthermore, the effect of the dielectric film formed under the ground metal is different. The dielectric film of the present invention formed under the ground metal is provided to protect the active devices and to form insulating films for capacitors. In contrast, the dielectric layers of the prior arts are provided to separate the signal lines.

(3) The ground metal of the present invention has windows over active devices to be used. On the other hand, the ground metals of the prior arts have no windows, although they have through holes. The windows are an essential requirement to avoid degradation in the performance of the active devices to be used because the performance of the active devices covered by ground metal via the thin dielectric film would be degraded.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 1:
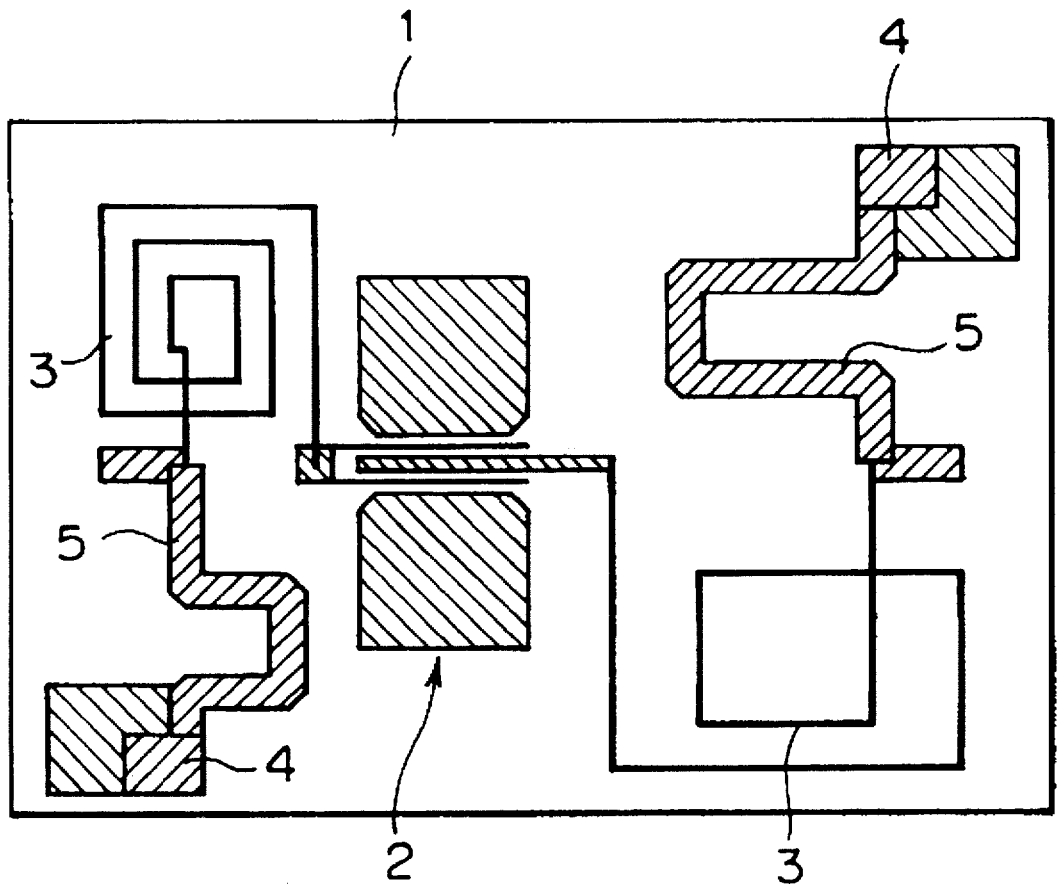
FIG. 1 is a plan view showing a conventional monolithic integrated circuit.
Figure 2:
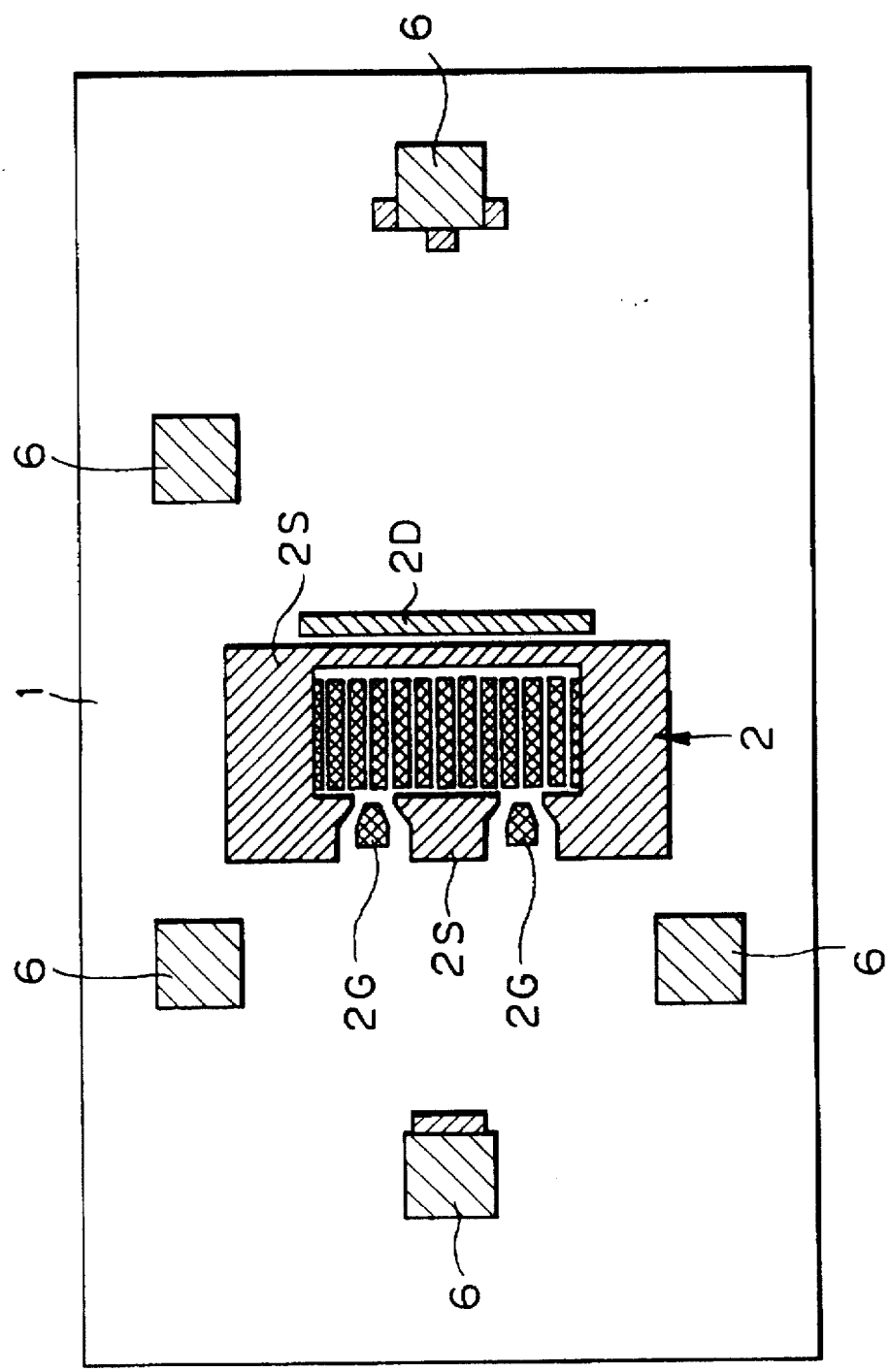
FIG. 2 is a plan view showing a common substrate of a conventional master-slice monolithic integrated circuit.
Figure 3A:
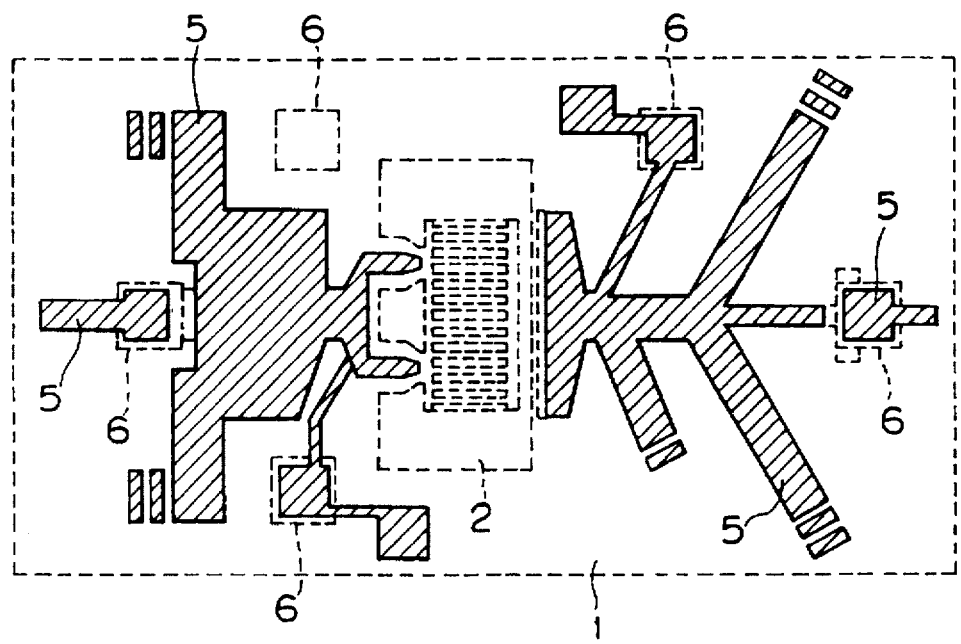
FIG. 3A is a plan view showing a wiring pattern for implementing a 27 GHz narrowband amplifier by using the conventional master-slice monolithic integrated circuit.
Figure 3B:
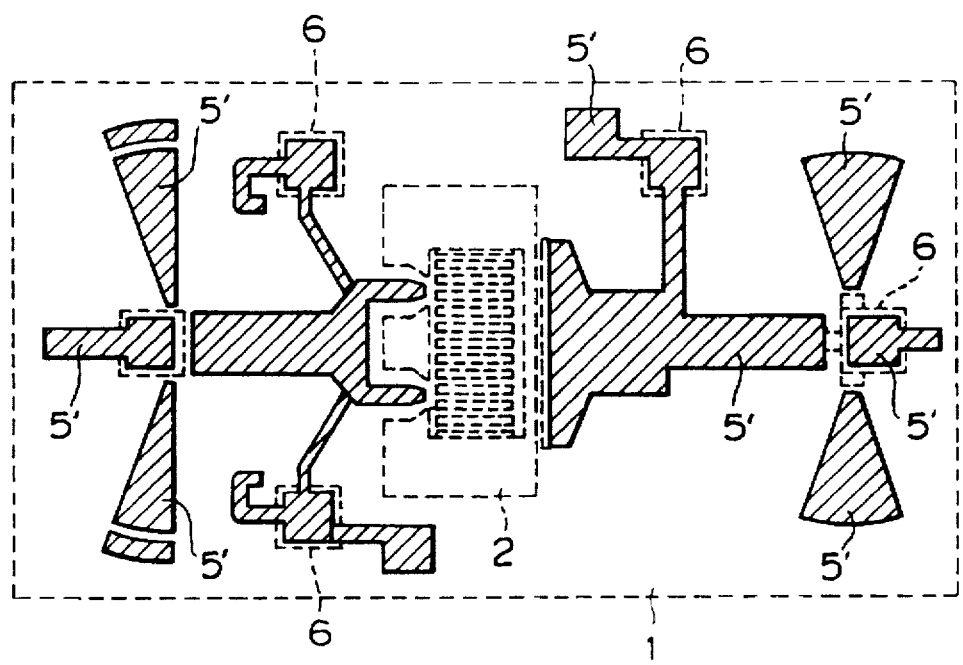
FIG. 3B is a plan view showing a wiring pattern for implementing a 30 GHz wideband amplifier by using the conventional master-slice monolithic integrated circuit.
Figure 4A:
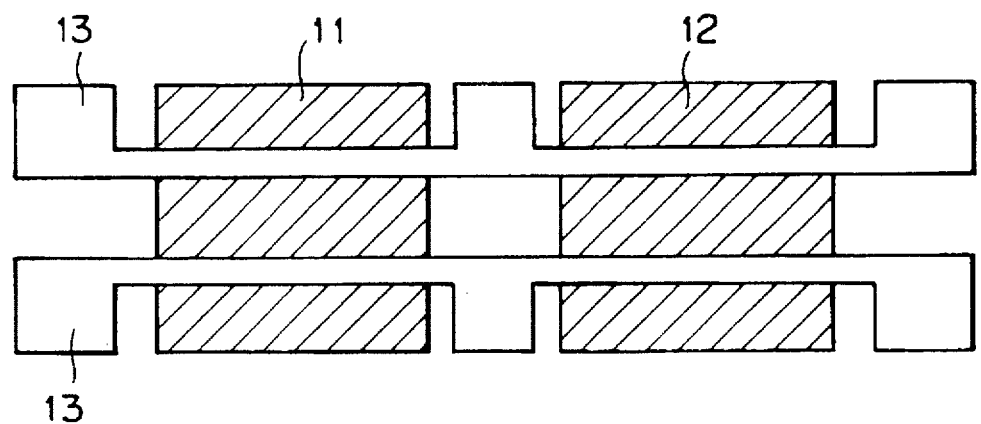
FIG. 4A is a plan view showing a basic internal cell of a conventional gate array LSI.
Figure 4B:
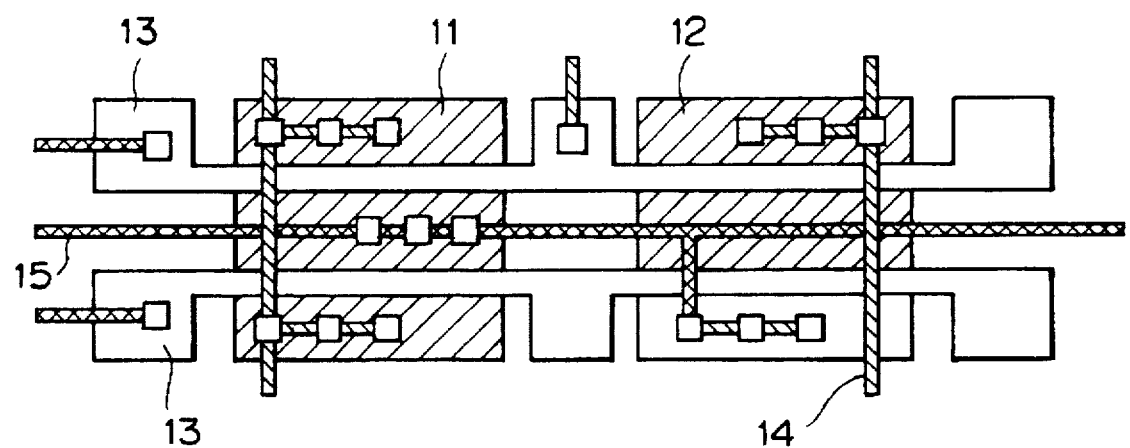
FIG. 4B is a plan view showing a two-input NAND circuit implemented by using the basic internal cell of FIG. 4A.
Figure 5:
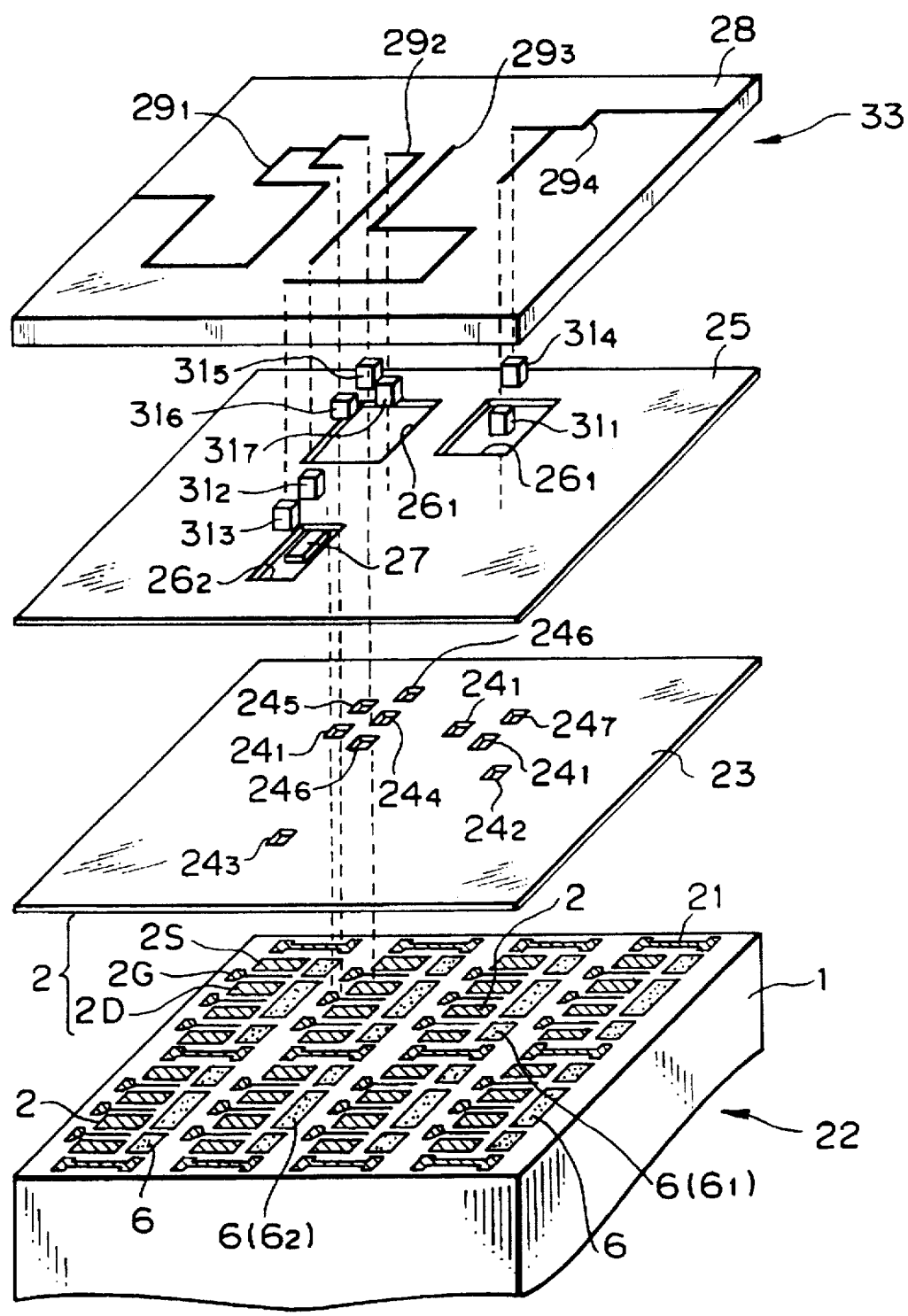
FIG. 5 is an exploded perspective view showing a first embodiment of a monolithic integrated circuit in accordance with the present invention.

FIG. 5 shows a first embodiment of a monolithic integrated circuit in accordance with the present invention. A number of active devices 2 are formed on a surface (a main surface) of a semiconductor substrate 1. In this embodiment, lower electrode conductors 6 of MIM capacitors and ion-implanted resistors 21 are formed as passive elements in addition to the active devices 2. In this embodiment, the active devices are FETs each having a source 2S, a gate 2G and a drain 2D. Sets of FETs, each consisting of three FETs, are arrayed in rows and columns, and each set is provided with a set of three lower electrode conductors 6 of capacitors juxtaposed with the three FETs. The middle one of the lower electrode conductors 6 of each set is about three times longer than those on both sides thereof. Each resistor 21 is formed on one side of each FET set in such a fashion that the longitudinal direction of the resistor is perpendicular to the line of the three FETs. Thus, a plurality of groups, each consisting of three FETs 2, three lower electrode conductors 6 and one resistor 21, are arrayed in rows and columns. The semiconductor substrate, on which these active devices 2 and passive elements 6 and 21 are formed, is used as a common substrate 22.

A dielectric thin film 23 is formed on the surface of the semiconductor substrate 1, on which the active devices are formed. The dielectric film 23 is a passivation which protects the active devices 2 and other elements formed on the semiconductor substrate 1, and functions as an insulator of the MIM capacitor. Connecting holes $24_1$, $24_2$, . . . are formed in the dielectric film 23 at positions corresponding to connected electrodes of the active devices 2, lower electrode conductors 6 and the resistors 21, which are to be used, in accordance with the layout of a circuit that accomplishes a desired function. The dielectric film 23 is made of $SiO_2$ film or $SiN_4$ film, for example, and its thickness is set at about 1000–5000 angstroms. This thickness of the dielectric film 23 is a normal thickness employed as insulating films of thin film capacitors, or as passivations for active devices, but not the thickness of films for separating high frequency transmission lines and ground metals. The connecting holes $24_1$, $24_2$, ... are formed by photoetching or dry etching.

Next, substantially the entire surface of the dielectric film 23 is covered with a ground metal 25. The ground metal 25 is provided with windows $26_1$, $26_2$, ... formed at positions corresponding to the active devices 2 and passive elements 6 and 21, which are to be used, in accordance with the circuit layout. In addition, an upper electrode conductor 27 is formed in the window $26_1$ simultaneously with the ground metal 25 at the position corresponding to the lower electrode conductor 6 to form a capacitor which is to be used in the circuit. Although not shown in this figure, a center conductor which constitutes a coplanar transmission line together with the ground metal 25 may be formed simultaneously with the ground metal 25. Thus, no unnecessary windows are formed in the ground metal 25. The ground metal 25 is made of Au, for example, and its thickness is set at about 1 μm. The windows $26_1$, $26_2$, ... are formed by ion-milling or the like.

A dielectric film 28 of approximately 1–10 micron thickness and made of polyimide, for example, is formed on the ground metal 25. Then, signal lines $29_1$, $29_2$, ... are formed on the dielectric film 28, after through holes $31_1$, $31_2$, ... have been formed in the dielectric film 28. The through holes are necessary for completing the desired circuit by connecting the signal lines $29_1$, $29_2$, ... with the electrodes of the active devices 2 and passive elements 6 and 21, and the upper electrode conductor 27. Thus, the signal lines $29_1$, $29_2$, ... are formed by the following procedures: providing in advance small holes at positions at which the through holes $31_1$, $31_2$, ... are to be formed; forming an Au layer on the entire surface of the dielectric film 28; forming the through holes $31_1$, $31_2$, ... at the small holes; and patterning the Au layer. The dielectric film 28 and the signal lines $29_1$, $29_2$, ... constitute a signal line layer 33. Thus, selected components on the substrate 22 are interconnected by conductive members which have rising portions that rise from the substrate through the small holes and spreading portions that spread laterally, the spreading portions being provided by the signal lines $29_1$, $29_2$, etc.

Figure 6A:
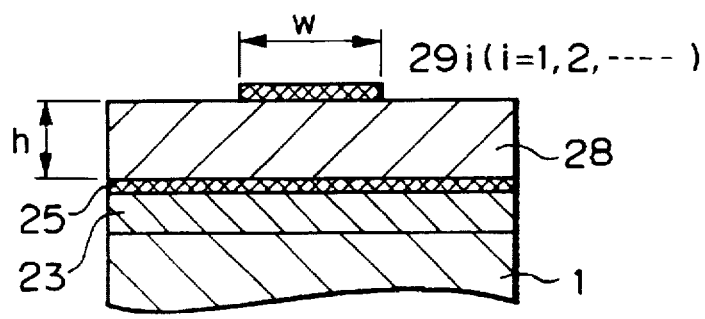
FIG. 6A is a sectional view showing a high frequency transmission line implemented in the first embodiment.
Figure 6B:
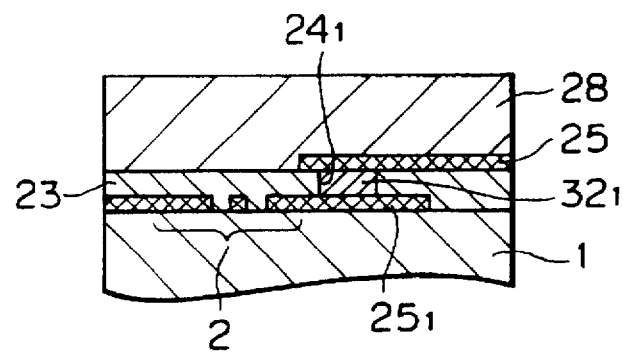
FIG. 6B is a sectional view showing a grounded state of an electrode of an active device of the first embodiment.

FIGS. 6A–6D show respective sections of the monolithic integrated circuit of the embodiment thus constructed. As shown in FIG. 6A, in accordance with the monolithic integrated circuit, the signal lines $29_1$, $29_2$, ..., together with the ground metal 25, form microstrip lines. As shown in FIG. 6B, any electrodes to be grounded, the source $25_1$ of an active device 2 in use, for example, is connected to the ground metal 25 through a connecting conductor $32_1$ inserted in the hole $24_1$. The connecting conductor $32_1$ is automatically formed at the same time as the ground metal 25 is formed.

Figure 6C:
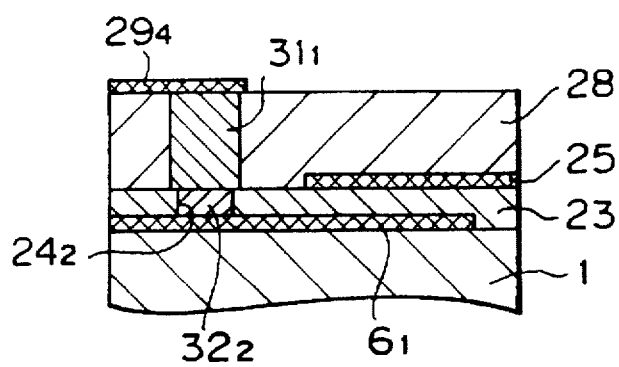
FIG. 6C is a sectional view showing a portion in which a bypass capacitor is formed in the first embodiment.

FIG. 6C shows a capacitor composed of the lower electrode conductor $6_1$ and the portion of the ground metal 25 facing the lower electrode conductor $6_1$. One end of the capacitor, that is, the lower electrode conductor $6_1$, is connected to the signal line $29_4$ through a connecting conductor $32_2$ inserted in the hole $24_2$ and the through hole $31_1$, and the other end of the capacitor is connected to the ground metal 25 to be grounded. The connecting conductor $32_2$ and the through hole $31_1$ are automatically formed at the same time as the Au layer for the signal lines $29_1$, $29_2$, ... is formed.

Figure 6D:
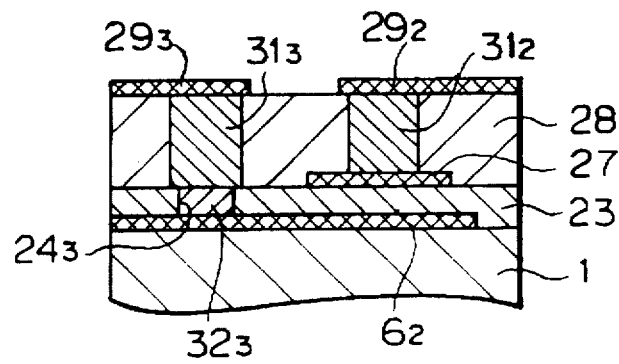
FIG. 6D is a sectional view showing a portion in which a capacitor is formed which is serially inserted between signal lines in the first embodiment.

FIG. 6D shows a capacitor composed of the upper electrode conductor 27 and the lower electrode conductor $6_2$. One end of the capacitor, that is, the upper electrode conductor 27, is connected to the signal line $29_2$ via the through hole $31_2$, and the other end of the capacitor, that is, the lower electrode conductor $6_2$, is connected to the signal line $29_3$ through a connecting conductor $32_3$ inserted in the hole $24_3$ and the through hole $31_3$. Thus, the capacitor is connected between the signal lines $29_2$ and $29_3$.

The monolithic integrated circuit thus formed can reduce fabrication cost and turn around time of development because the position of the active devices 2 such as FETs is determined in advance, and hence the semiconductor substrate 1 can be widely used as a common substrate 22 for various types of circuits. In addition, since the active devices 2 and the passive elements 6 and 21 which are not used are covered with the planar ground metal 25, wiring can be achieved immediately over these unused devices and elements, thereby reducing the size of the circuit.

Furthermore, since the unused devices and elements are covered with the ground metal 25, these unused devices 2 and elements 6 and 21 are negligible for the passive circuit formed in the signal line layer 33 on the ground metal. As a result, the degree of freedom for wiring increases, and this enables the circuit to save extra signal lines by making it unnecessary for the signal lines to be drawn in such a fashion that they bypass the active devices 2. This also makes it possible to reduce the effect of the stray inductance and capacitance.

Figure 7A:
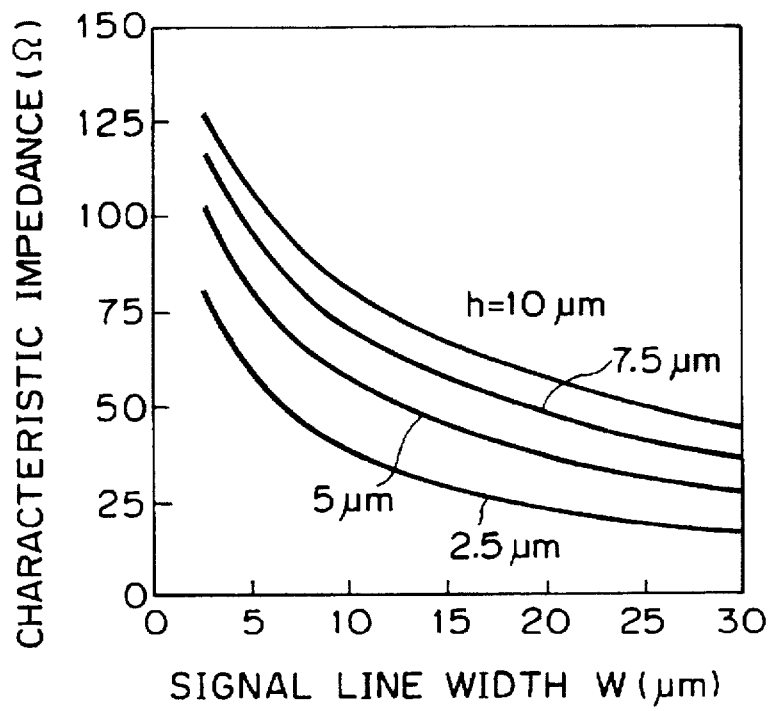
FIG. 7A is a graph illustrating the characteristic impedance of a microstrip line computed by the finite element method.
Figure 7B:
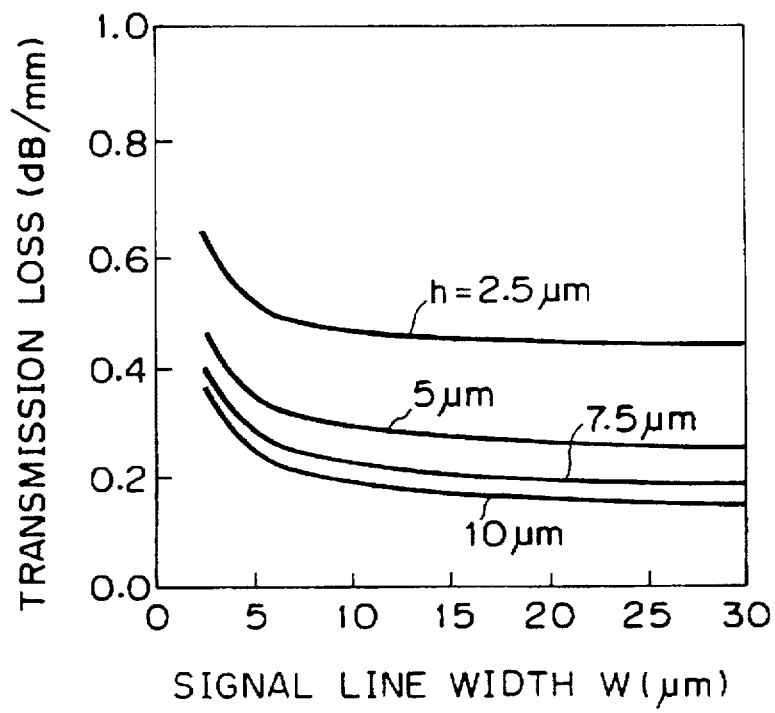
FIG. 7B is a graph illustrating the transmission loss of the microstrip computed by the finite element method.

FIGS. 7A and 7B show characteristic impedances and transmission losses of the signal lines (microstrip lines) $29_i$ of width W. The structure and parameters of the microstrip lines are shown in FIG. 6A. These values were computed by the finite element method with the thickness h of the dielectric film 28 used as a parameter. The computation was performed under the condition that the relative dielectric constant of the dielectric film 28 was 3.3, the conductivity of the signal line $29_i$ was $4.908 \times 10^7$ S/m, its thickness was 1 μm, and the frequency was 10GHz.

It can be inferred from FIG. 7A that the width of the signal line $29_i$ must be made very narrow to implement a transmission line of 50ohms, which is most frequently used in high frequency circuits like microwave circuits, when the thickness h of the dielectric film 28 is equal to or less than 1 micron. Such a narrow width may not be achieved depending on the accuracy of a process. Even if such a narrow width signal line is realized, its transmission loss will be rather large as can be inferred from FIG. 7B, and this will degrade the circuit characteristics.

The present invention, however, sets the thickness h of the dielectric film 28 at equal to or greater than 1 micron, and preferably at 1–10 microns, for example. This makes it possible to implement a transmission line with a characteristic impedance from 10 ohms to 100 ohms commonly employed in high frequency circuits. This can be inferred from the fact that the characteristic impedance is approximately 15 ohms when h=2.5 μm and W=30 μm, in which case the transmission loss is sufficiently low for practical application.

Using polyimide as the dielectric film 28 can implement multilayer film with a flat surface by low temperature treatment, thereby improving circuit characteristics. In addition, the structure in FIG. 6 prevents extra signal lines from being drawn as much as possible. Forming an array of the groups, each consisting of the active devices, the resistors and the capacitor electrodes, on the substrate in advance, and selectively covering the elements by the ground metal 25 make it possible to implement a monolithic integrated circuit with large design facility, wherein devices and elements can be interconnected through short conductors.

EMBODIMENT 2

Figure 8:
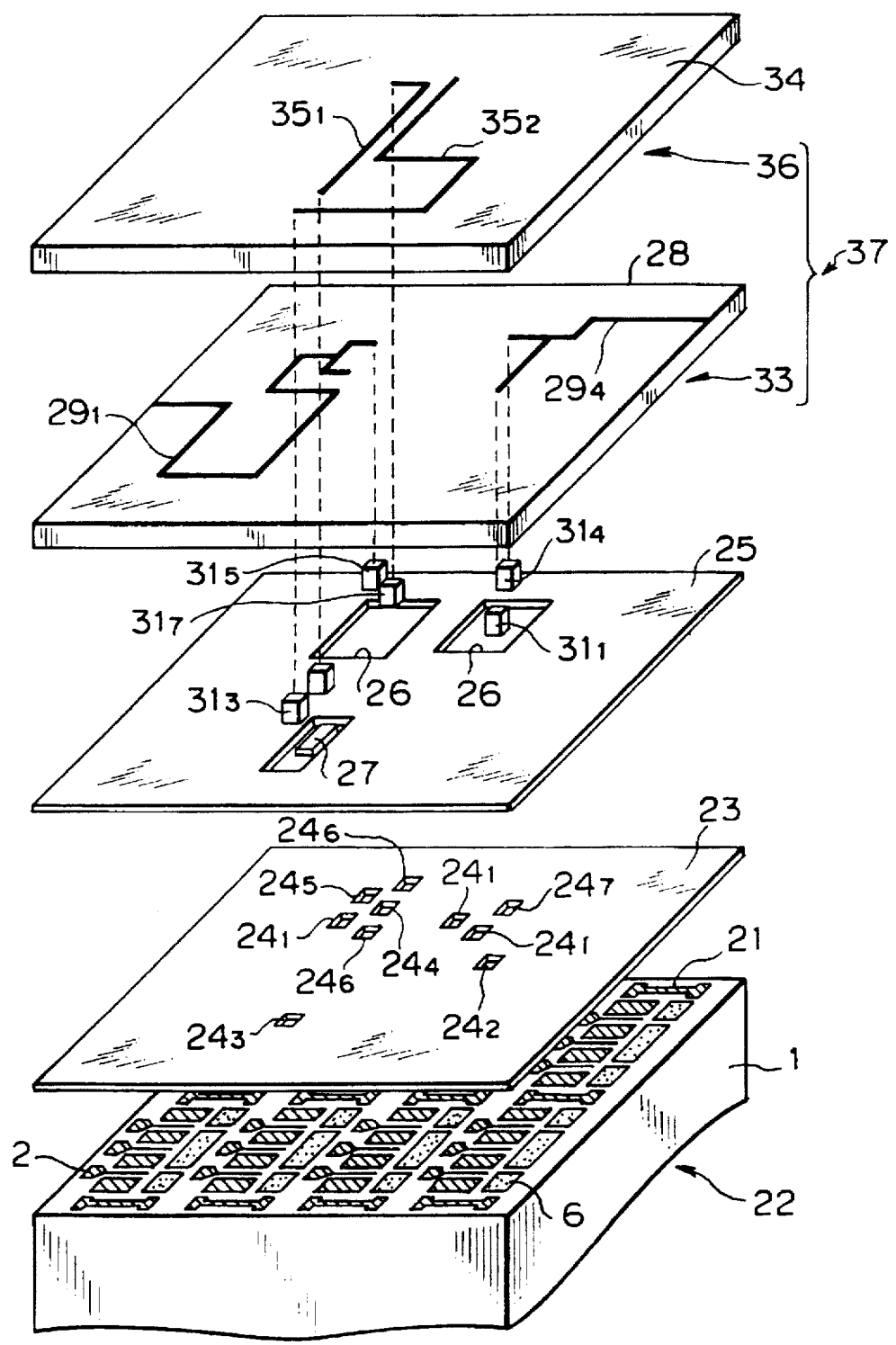
FIG. 8 is an exploded perspective view showing a second embodiment of a monolithic integrated circuit in accordance with the present invention.

FIG. 8 shows a second embodiment of a monolithic integrated circuit in accordance with the present invention. In this figure, the corresponding portions are designated by the same reference numerals as in FIG. 5. The second embodiment differs from the first embodiment of FIG. 5 in the following:

(1) A dielectric film 34 of a few microns in thickness is further formed on the dielectric film 28.

(2) Signal lines 35 are formed on the dielectric film 34, thereby forming a signal line layer 36 consisting of the dielectric film 34 and the signal lines 35.

(3) Signal lines $35_1$ and $35_2$ are formed instead of the corresponding signal lines $29_2$ and $29_3$ which are removed in this embodiment.

(4) Thus, a multilayer passive circuit 37 is formed which consists of the signal line layers 33 and 36.

In short, a desired circuit is configured by using the multilayer passive circuit 37 to interconnect the active devices and passive elements on the common substrate 22.

This embodiment can achieve the same effect and advantages as the first embodiment. In addition, the multilayer passive circuit 37 makes the line crossing easier than the signal line layer 33 of the first embodiment shown in FIG. 5, and increases the degree of freedom for the circuit layout.

EMBODIMENT 3

Figure 9:
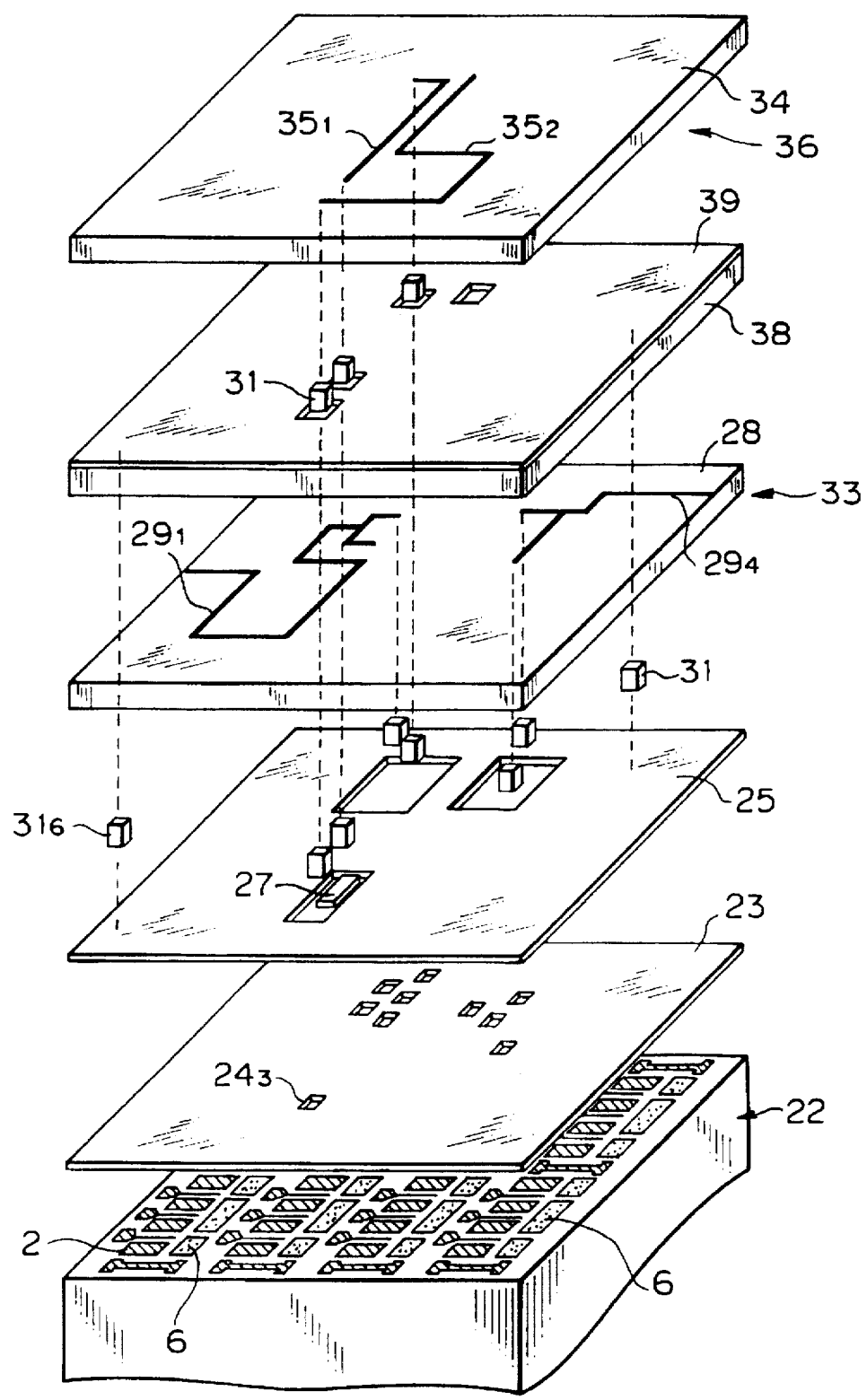
FIG. 9 is an exploded perspective view showing a third embodiment of a monolithic integrated circuit in accordance with the present invention.

FIG. 9 shows a third embodiment of a monolithic integrated circuit in accordance with the present invention. The third embodiment differs from the second embodiment shown in FIG. 8 in that it further includes a dielectric film 38 and a ground metal 39 inserted between the signal line layers 33 and 36, and provides highly isolated signal lines $29(29_1, 29_2 \ldots)$ and $35(35_1, 35_2 \ldots)$. Thus, signal lines of a uniform impedance can be obtained.

EMBODIMENT 4

Figure 10:
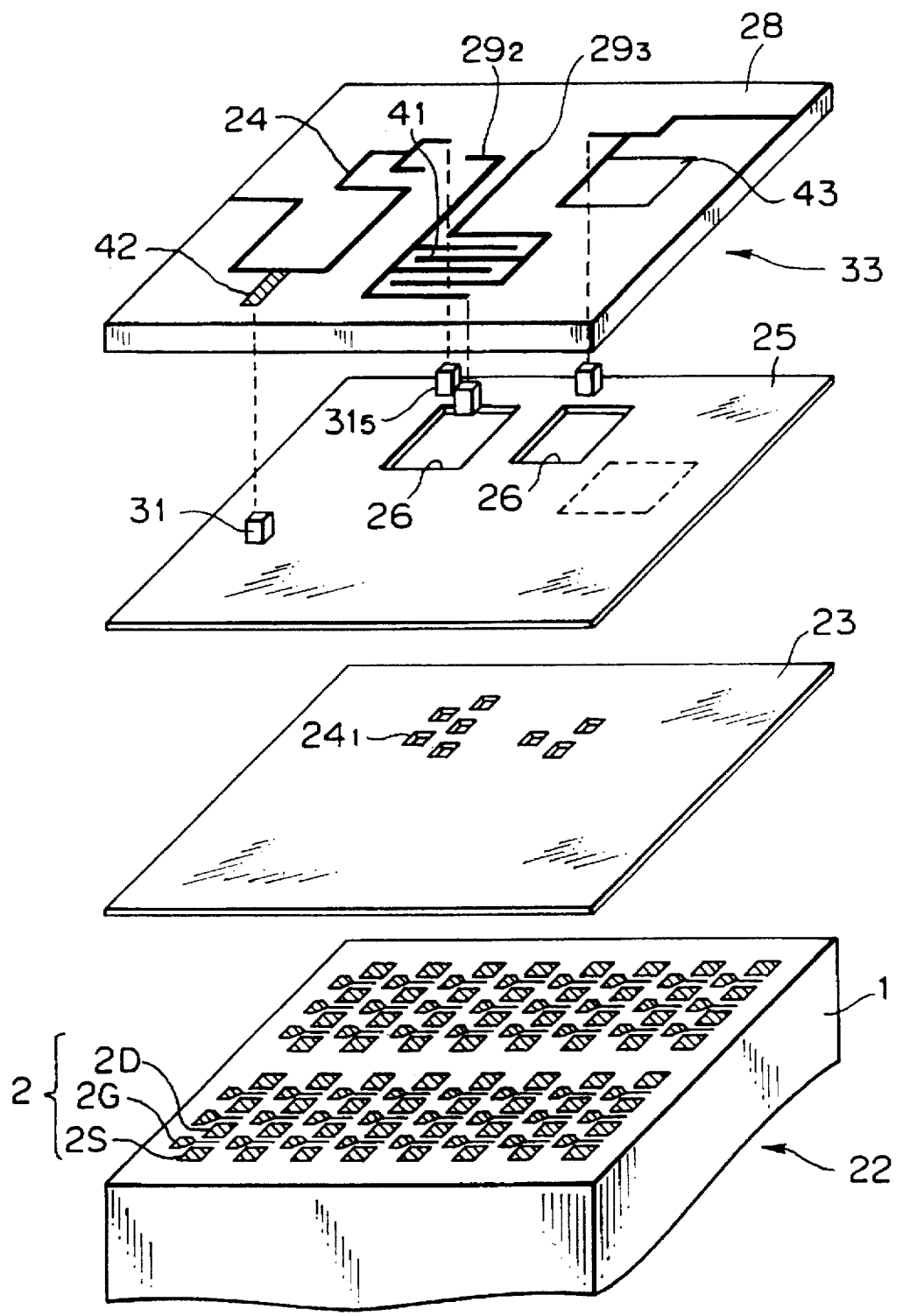
FIG. 10 is an exploded perspective view showing a fourth embodiment of a monolithic integrated circuit in accordance with the present invention.

FIG. 10 shows a fourth embodiment of a monolithic integrated circuit in accordance with the present invention. In this embodiment, only active devices 2 are arrayed on the common substrate 22 in such a manner that a plurality of sets, each consisting of three of the FETs in FIG. 5, are formed in rows and columns. Furthermore, an interdigital capacitor 41, a metal resistor 42 formed by printing a high resistance metal, and an upper electrode conductor 43 constituting a capacitor are formed on the dielectric film 28 in addition to the signal lines 29. Thus forming the passive elements on the dielectric film 28 instead on the common substrate 22 increases the degree of freedom for disposing the passive elements, thereby implementing a miniaturized, high density integrated circuit.

The multilayer passive circuit including the high frequency transmission lines as shown in FIG. 8 or 9 can also be employed in combination with the common substrate 22 shown in FIG. 10.

Although the active devices 2 are arrayed in rows and columns in the foregoing embodiments, they can be configured in any form. In addition, although the active devices 2 are grouped together every three devices, they may be grouped every two or four or more devices. Furthermore, a single active device may be used instead of each group of a plurality of FETs.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A monolithic integrated circuit comprising:
   a semiconductor substrate on which a plurality of active devices are formed;
   a first dielectric film formed on said active devices;
   a selecting plate formed on said first dielectric film, said selecting plate consisting of one or more windows and a covering portion, said one or more windows being formed over active devices to be used among said active devices, and said covering portion covering active devices to be unused among said active devices;
   a second dielectric film formed on said selecting plate;
   a signal line layer formed on said second dielectric film; and
   connecting means for connecting said active devices to be used with said signal line layer,
   wherein said one or more windows formed over active devices to be used are at least as large as said active devices to be used, so that said covering portion of said selecting plate does not extend over said active devices to be used.

2. The monolithic integrated circuit as claimed in claim 1, wherein said selecting plate consists of a first ground metal.

3. The monolithic integrated circuit as claimed in claim 2, wherein said first ground metal is spaced 1,000–5000 angstroms from said semiconductor substrated.

4. The monolithic integrated circuit as claimed in claim 1, wherein said signal line layer comprises first signal lines for interconnecting said active devices to be used.

5. The monolithic integrated circuit as claimed in claim 4, wherein said second dielectric film is equal to or greater than one micron in thickness.

6. The monolithic integrated circuit as claimed in claim 1, further comprising another signal line layer which disposed above said signal line layer formed on said second dielectric film.

7. The monolithic integrated circuit as claimed in claim 1, wherein said signal line layer is a first signal line layer and further comprising a third dielectric film disposed above said first signal line layer and said second dielectric film, and a second signal line layer formed on said third dielectric film.

8. The monolithic integrated circuit as claimed in claim 7, wherein said second dielectric film and said third dielectric film are each equal to or greater than one micron in thickness.

9. The monolithic integrated circuit as claimed in claim 7, wherein said selecting plate comprises a first ground metal, and further comprising:
   a fourth dielectric film disposed between said second and third dielectric films; and
   a second ground metal disposed between said third dielectric film and said fourth dielectric film.

10. The monolithic integrated circuit as claimed in claim 9, wherein said second dielectric film, said third dielectric film, and said fourth dielectric film are each equal to or greater than one micron in thickness.

11. The monolithic integrated circuit as claimed in claim 1, wherein said active devices on said semiconductor substrate are juxtaposed with a plurality of passive elements formed on said semiconductor substrate, one or more of said passive elements being connected with said signal line layer.

12. The monolithic integrated circuit as claimed in claim 11, wherein said passive elements comprise a plurality of first capacitor electrode conductors formed on said semiconductor substrate, one or more pieces of said first capacitor electrode conductors forming capacitors with said selecting plate and said first dielectric film, wherein said capacitors are connected to said signal line layer.

13. The monolithic integrated circuit as claimed in claim 11, further comprising a plurality of second capacitor electrode conductors which are formed on a same plane as said selecting plate and insulated from said selecting plate, wherein said passive elements comprise a plurality of first capacitor electrode conductors formed on said semiconductor substrate, wherein one or more pieces of said first capacitor electrode conductors form capacitors with corresponding portions of said second capacitor electrode conductors and said first dielectric film, and wherein said capacitors are connected to said signal line layer.

14. The monolithic integrated circuit as claimed in claim 1, wherein said signal line layer comprises one or more passive elements which are connected to said active devices to be used.

15. The monolithic integrated circuit as claimed in claim 1, wherein said signal line layer comprises a coplanar waveguide which is connected to said active devices to be used.

16. A monolithic integrated circuit, comprising:
a semiconductor substrate on which a plurality of active devices are formed, the active devices including a transistor having first, second, and third transistor elements, the semiconductor substrate additionally having a surface;
a ground metal layer disposed at a predetermined height above the substrate;
at least one dielectric layer disposed above the ground metal layer; and
means for connecting the transistor to other active devices to form a circuit, the means for connecting including a first conductive member having a rising portion which contacts the first transistor element and which rises at least to the height of the ground metal layer, a second conductive member having a rising portion which contacts the second transistor element and which rises at least to the height of the ground metal layer, and a third conductive member having a rising portion which contacts the third transistor element and which rises at least to the height of the ground metal layer, at least two of the first, second, and third conductive members additionally having spreading portions which follow the rising portions, the spreading portions extending generally parallel to the surface of the substrate,
wherein all of the spreading portions of the first, second, and third conductive members are fabricated on the at least one dielectric layer disposed above the ground metal layer,
wherein those of the first, second, and third conductive members that have spreading portions extend through at least one opening in the ground metal layer, and the rising portion of any of the first, second, and third conductive members that do not have a spreading portion is connected to the ground metal layer, and
wherein the at least one opening in the ground metal layer is a single window which lies over the transistor and is at least as large as the transistor.

17. The monolithic integrated circuit as claimed in claims 16, further comprising an additional dielectric layer between the substrate and the ground metal layer, and wherein the means for connecting further comprises a lower conductor electrode on the substrate and an upper conductor electrode at the height of the ground metal layer, the upper and lower conductor electrodes cooperating with the additional dielectric layer to form a capacitor.

18. The monolithic integrated circuit as claimed in claim 17, wherein the upper conductor electrode is separated from the ground metal layer by a slot in the ground metal layer, the slot surrounding the upper conductor electrode.

19. The monolithic integrated circuit as claimed in claim 17, wherein the means for connecting additionally comprises an ion implanted resistor fabricated on the substrate.

20. A monolithic integrated circuit as claimed in claim 16, wherein the active devices on the substrate include a transistor which is not part of the circuit, and the ground metal layer covers the transistor which is not part of the circuit.

21. A monolithic integrated circuit as claimed in claim 20, wherein the spreading portion of one of the first, second, and third conductive members extends over the transistor which is not part of the circuit.

22. A monolithic integrated circuit, comprising:
a semiconductor substrate on which a plurality of active devices are formed, the active devices including a transistor having first, second, and third transistor elements, the semiconductor substrate additionally having a surface;
a ground metal layer disposed at a predetermined height above the substrate;
at least one dielectric layer disposed above the ground metal layer; and
means for connecting the transistor to other active devices to form a circuit, the means for connecting including a first conductive member having a rising portion which contacts the first transistor element and which rises at least to the height of the ground metal layer, a second conductive member having a rising portion which contacts the second transistor element and which rises at least to the height of the ground metal layer, and a third conductive member having a rising portion which contacts the third transistor element and which rises at least to the height of the ground metal layer, at least two of the first, second, and third conductive members additionally having spreading portions which follow the rising portions, the spreading portions extending generally parallel to the surface of the substrate,
wherein all of the spreading portions of the first, second, and third conductive members are fabricated on the at least one dielectric layer disposed above the ground metal layer, and
wherein the at least one opening in the ground metal layer is a single window which lies over the transistor that is connected to other active elements and is at least as large as the transistor that is connected to other active elements.

23. The monolithic integrated circuit as claimed in claim 22, further comprising an additional dielectric layer between the substrate and the ground metal layer, and wherein the means for connecting further comprises a lower conductor electrode on the substrate and an upper conductor electrode at the height of the ground metal layer, the upper and lower conductor electrodes cooperating with the additional dielectric layer to form a capacitor.

24. The monolithic integrated circuit as claimed in claim 23, wherein the upper conductor electrode is separated from the ground metal layer by a slot in the ground metal layer, the slot surrounding the upper conductor electrode.

25. The monolithic integrated circuit as claimed in claim 23, wherein the means for connecting additionally comprises an ion implanted resistor fabricated on the substrate.

26. A monolithic integrated circuit, comprising:
- a semiconductor substrate on which a plurality of active devices are formed, the active devices including a first transistor and a second transistor adjacent the first transistor;
- a ground metal layer which is spaced apart from the substrate, the ground metal layer covering the first transistor but having a window over the second transistor, the window being aligned with the second transistor and being at least as large as the second transistor;
- at least one dielectric film disposed over the ground metal layer; and
- means for connecting the second transistor to other active elements to form a circuit which does not include the first transistor, the means for connecting including signal lines which are formed on the at least one dielectric film and which are connected to the second transistor via the window.

27. A monolithic integrated circuit as claimed in claim 26, wherein at least one of the signal lines extends over the first transistor.

28. A monolithic integrated circuit as claimed in claim 26, wherein the active devices are formed on the substrate in a repeating pattern.

29. A monolithic integrated circuit as claimed in claim 26, further comprising an additional dielectric film disposed between the substrate and the ground metal layer, and wherein the means for connecting further comprises lower conductor electrodes on the substrate and upper conductor electrodes provided at the ground metal layer to form capacitors with the lower conductor electrodes.

30. A monolithic integrated circuit as claimed in claim 29, wherein the means for connecting further comprises ion implanted resistors formed on the substrate.

31. A monolithic integrated circuit as claimed in claim 30, wherein the active devices, lower conductor electrodes, and ion implanted resistors are arranged in an array of element sets, each element set including a plurality of active devices, at least one lower electrode conductor, and at least one ion implanted resistor, the element sets being disposed in rows and columns in the array.

* * * * *